United States Patent [19]
Kim

[11] Patent Number: 5,877,990
[45] Date of Patent: Mar. 2, 1999

[54] SEMICONDUCTOR MEMORY DEVICE AND METHOD

[75] Inventor: Tae-Hyoung Kim, Kyunggi-do, Rep. of Korea

[73] Assignee: LG Semicon Co., Ltd., Cheongju-si, Rep. of Korea

[21] Appl. No.: 953,342

[22] Filed: Oct. 17, 1997

Related U.S. Application Data

[60] Provisional application No. 60/002,674, Jun. 20, 1995.

[30] Foreign Application Priority Data

May 29, 1997 [KR] Rep. of Korea ................. 1997 21680

[51] Int. Cl.$^6$ ....................................................... G11C 7/00
[52] U.S. Cl. ...................................... 365/189.05; 365/221
[58] Field of Search ............................... 365/189.05, 205, 365/221, 206, 230.08

[56] References Cited

U.S. PATENT DOCUMENTS

| | | | |
|---|---|---|---|
| 5,278,790 | 1/1994 | Kanabara | 365/189.05 |
| 5,517,461 | 5/1996 | Unno et al. | 365/189.05 |
| 5,530,955 | 6/1996 | Kaneko | 365/189.05 |
| 5,559,990 | 9/1996 | Cheng et al. | 395/484 |
| 5,699,311 | 12/1997 | Sato et al. | 365/189.05 |

*Primary Examiner*—Son T. Dinh
*Attorney, Agent, or Firm*—Fleshner & Kim

[57] ABSTRACT

A semiconductor memory device and method are provided that enhance data output speed of a DRAM or the like by reducing the time difference between the data output operation from a preceding word line and the data output operation from a succeeding word line. The semiconductor memory device includes a memory cell array arranged with multiple memory cells having a corresponding word line and a corresponding bit line, a row decoder for decoding a row address to select and activate a word line of the memory cell array and a sense amplifier for sensing and amplifying the data in a memory cell coupled to the activated word line when the data is applied to the corresponding bit line. The semiconductor further includes first and second latches respectively storing data using the sense amplifier taken from a memory cell coupled to a preceding activated word line and a succeeding activated word line. A switching block controls the data path between the sense amplifier and the first latch, or the sense amplifier and the second latch and a column decoder selects and applies the data stored in the first or second latch to a data bus. A data bus sense amplifier amplifies the data applied to the data bus before transmitting it to a data output buffer.

17 Claims, 4 Drawing Sheets

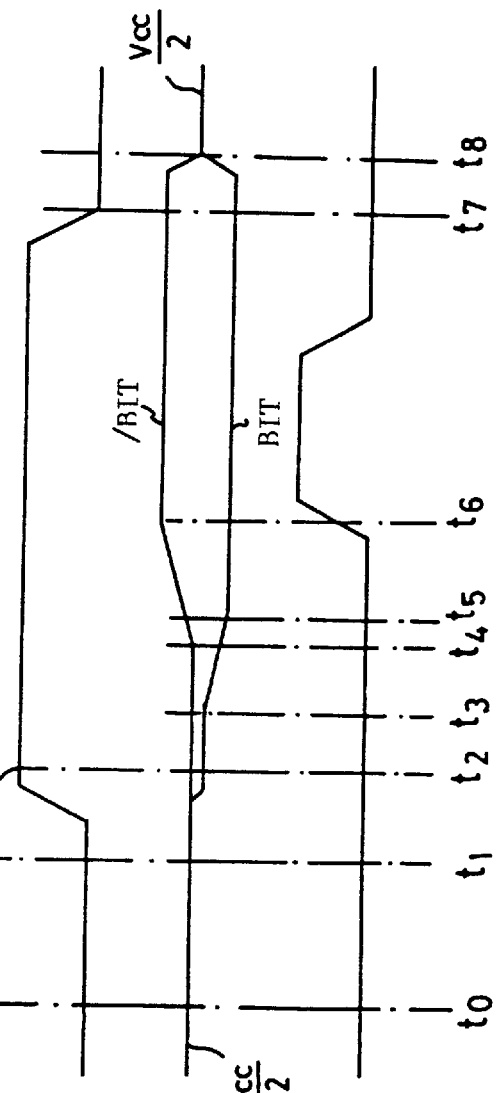
FIG. 3(a) (BACKGROUND ART) /RAS
FIG. 3(b) (BACKGROUND ART) /CAS
FIG. 3(c) (BACKGROUND ART) /WE
FIG. 3(d) (BACKGROUND ART) /WL
FIG. 3(e) (BACKGROUND ART) BIT /BIT
FIG. 3(f) (BACKGROUND ART) CD

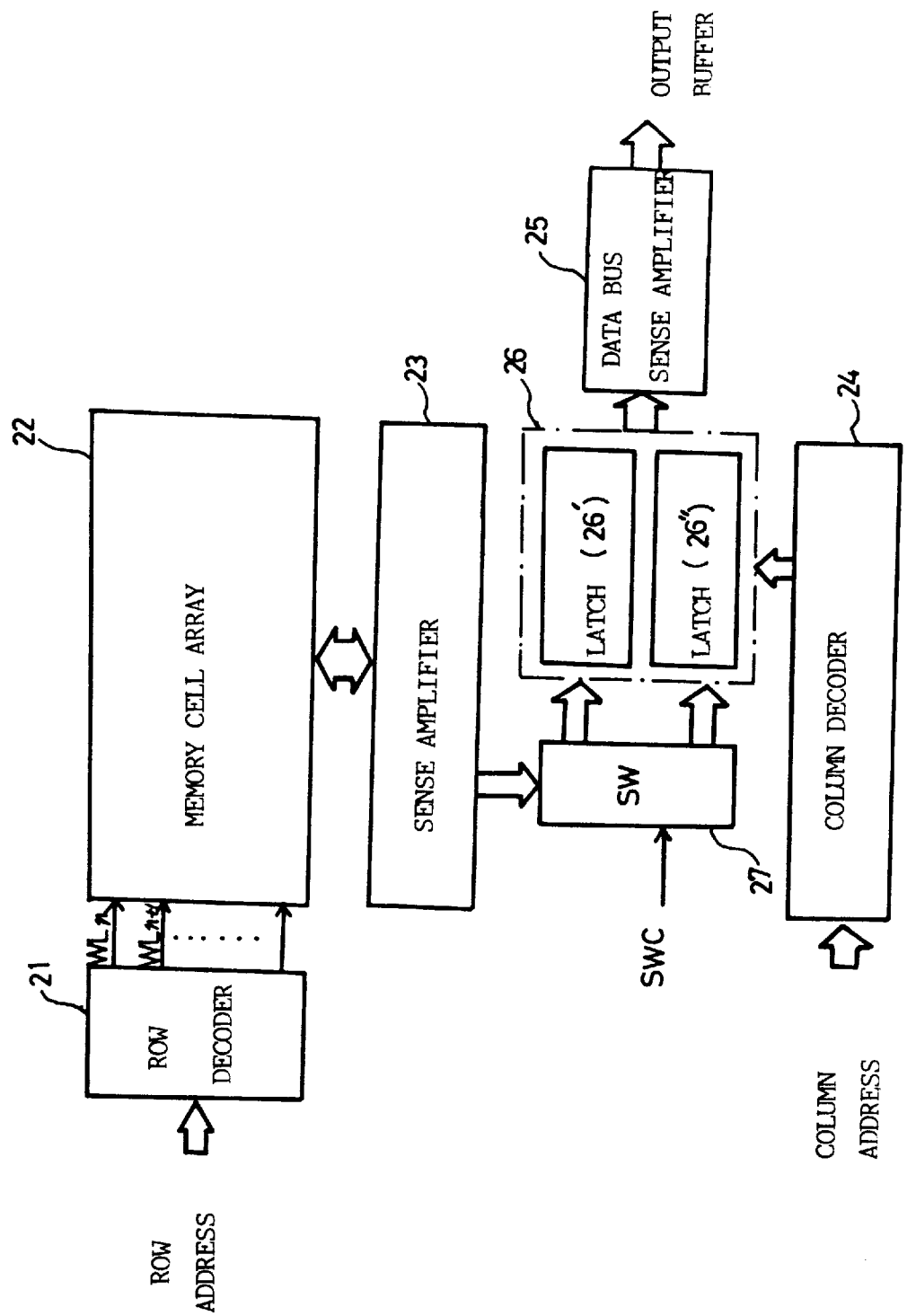

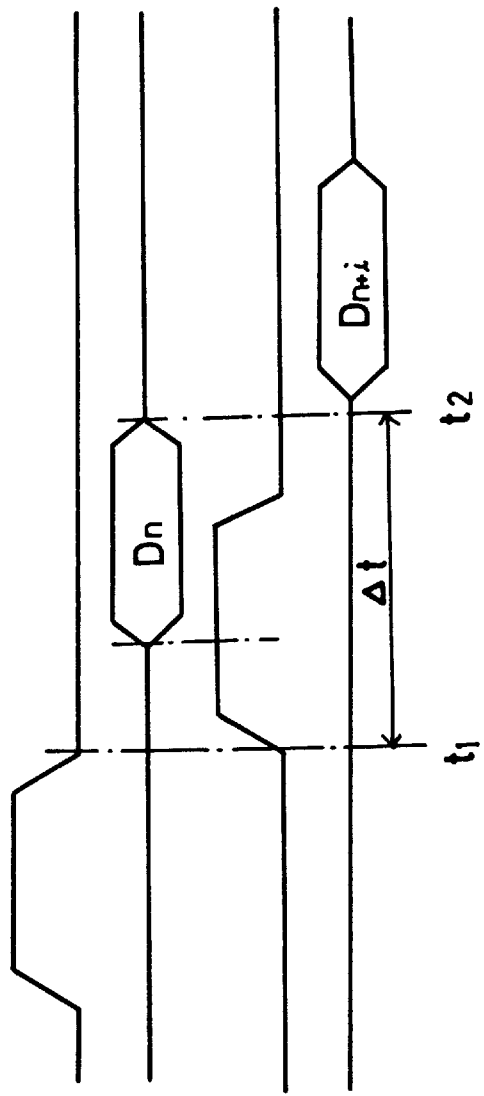

SEMICONDUCTOR MEMORY DEVICE AND METHOD

This is a provisional application Ser. No. 60/002,674, filed Jun. 20, 1995.

BACKGROUND OF THE INVENTION

1. Field of the Invention

The present invention relates to a semiconductor memory device and method, and in particular, to a semiconductor memory device and method with enhanced data output speed.

2. Background of the Related Art

Various types of semiconductor memory devices are used in a computer system or other program driving system. Common memory devices include DRAM and SRAM. SRAM is very fast but expensive because of a low degree of integration. Therefore, DRAM is generally used in personal computers where the relatively low price and low speed are acceptable.

FIG. 1 is a block diagram showing the structure of a semiconductor memory cell array and peripheral circuits of a related art DRAM. As shown in FIG. 1, a row decoder 11 decodes a row address to select and activate a word line of a memory cell array 12. When a word line of the memory cell array 12 is activated, a column decoder 14 decodes a column address to select a bit line of the memory cell array 12. Sense amplifier 13 sequentially senses and amplifies data in a memory cell connected to the activated word line and then transmits the data to a data output buffer (not shown) through a data bus sense amplifier 15.

FIG. 2 is a circuit diagram depicting a memory cell of the memory cell array 12. The general structure of the memory cell includes a transistor and a capacitor. As shown in FIG. 2, a memory cell MCI has a structure with a capacitor C1 connected between the drain of NMOS transistor Q1 and ground. The source of NMOS transistor Q1 is connected to bit line BIT and the gate to the word line WLn.

As shown in FIG. 2, another memory cell MC2 includes an NMOS transistor Q2 and a capacitor C2. The gate of NMOS transistor Q2 is connected to a word line WLn+1 and the source to a bit line /BIT. As described above, when the word line WLn is activated, the NMOS transistor Q1 is turned on. When the word line WLn+1 is activated, the NMOS transistor Q2 is turned on.

The capacitors C1 and C2 are charged or discharged in accordance with the logic value of data. For example, when the word lines WLn and WLn+1 are respectively activated in a data read mode, the data charged is discharged through the turned on NMOS transistors Q1 and Q2. The discharged data is applied to the bit lines BIT and /BIT so that the bit lines BIT and /BIT vary in voltage. If the capacitors are not charged, there is no change in the voltage of the bit lines BIT and /BIT.

The two bit lines BIT and /BIT are precharged with a voltage of VCC/2. When the NMOS transistors Q1 and Q2 of the memory cells MC1 and MC2 are turned on so that the data of the capacitors C1 and C2 are respectively transmitted to the bit lines BIT and /BIT, the sense amplifier 13 compares the voltage difference between the two bit lines BIT and /BIT, and amplifies the voltage difference.

Referring to FIGS. 1 to 3, the data read operation of the related art semiconductor memory device will now be described. FIG. 3 is a timing chart showing the read operation of a related art semiconductor memory device. The case data of "0" being stored in the memory cell will be described as an example.

FIG. 3(a) shows a row address strobe signal /RAS and FIG. 3(b) shows a column address strobe signal /CAS. FIG. 3(c) shows a write enable signal /WE and FIG. 3(d) shows a word line voltage. FIG. 3(e) shows voltages of a pair of bit lines BIT and /BIT. FIG. 3(f) shows a bit line selection signal CD transmitted from the column decoder 14.

The row address strobe signal /RAS indicates that the row address is input. The column address strobe signal /CAS indicates that the column address is input. The write enable signal /WE controls the read and write operations of the memory device. A high level of the write enable signal /WE causes the write operation and a low level causes the read operation.

Time t0 is a stand-by state of the timing charts of FIGS. 3(a)–3(f) where the voltage of the word line is low. As described with respect to FIG. 2, the two bit lines BIT and /BIT of the memory cell are pre-charged with the potential VCC/2 or half of the power voltage VCC.

At time t1, the two bit lines BIT and /BIT of FIG. 2 are in a floating state that is not affected by an outside environment. Accordingly, the two bit lines BIT and /BIT sustain the precharge potential VCC/2.

At time t2, the row decoder 11 decodes the row address transmitted from the outside to select word line (e.g., WLn). The row decoder 11 increases the voltage of the selected word line to the sum of the supply voltage VCC and a MOS transistor threshold voltage, Vt. In other words, the voltage level VCC+Vt, is a word line activation level that activates the word line (e.g., WLn).

The NMOS transistor Q1, whose gate is connected to the activated word line WLn, is turned on so that the data stored in the capacitor C1 is applied to the bit line BIT. As shown in FIG. 3, the data of the capacitor C1 is "0". The charges are applied to the bit line BIT in accordance with the data of the capacitor C1 so that the potential of the bit line BIT becomes a potential slightly lower or slightly higher than the precharge voltage VCC/2. The bit line /BIT sustains the precharge voltage VCC/2. Thus, the potential of a bit line to which a cell to be read is connected is changed and the bit line not connected to the cell to be read remains VCC/2. Accordingly, a specified potential difference exists between the two bit lines BIT and /BIT. The sense amplifier 13 is activated to amplify the potential difference between the bit lines BIT and /BIT between time point t3 and time point t4.

When the amplification by the sense amplifier 13 is achieved to some degree (e.g., between t5 and t6), the ground voltage VSS is applied to the bit line BIT and the supply voltage VCC is applied to the bit line /BIT. Thus, the voltage "0" or the potential of the ground voltage VSS is stored by the capacitor C1 through the NMOS transistor Q1, which is turned on by the high level voltage of the word line WLn. As the result, the data can be read and the refresh operation is performed (i.e., data is rewritten).

Such operations are executed when the data stored in the capacitor C1 is "0". If the data of the capacitor C1 is "1", the opposite operations are performed.

If the amplification operation of the sense amplifier 13 is achieved to some degree so the potential difference between the two bit lines BIT and /BIT exceeds the sum of the respective threshold voltages of usual PMOS and NMOS transistors or "|Vtn|+|Vtp|", a signal of the bit line BIT corresponding to the bit line selection signal CD is transmitted to the data output buffer using the data bus sense amplifier 15 via a data bus.

The data from the bit line is transmitted to the data output buffer through a data bus, which is connected to the bit line. The respective data buses switch according to the column address transmitted from the column decoder 14.

The data bus sense amplifier 15 amplifies the data that is transmitted from the bit line to the data bus, before transmitting it to the data output buffer. When the data transmission is completed, the data bus is precharged.

At time point t7, the word line WLn is deactivated to sustain the data stored in the capacitor C1 (e.g., by the refresh operation previously described). At time t8, for succeeding data output operations, the two bit lines BIT and /BIT are equalized by the precharge voltage VCC/2. Thus, the bit lines BIT and /BIT are placed in the stand-by state.

The series of data output operations in a related art semiconductor memory device as described above are performed with the deactivation operation of the word line whose data output is completed, and the activation of another word line whose new data will be output.

Thus, after the data transmission is completed from the activated word line, the precharge voltage is applied to the respective bit lines. Further, another word line cannot be activated until the voltage of the word line is lowered to the ground potential. Accordingly, related art semiconductor memory devices, especially DRAM, have slow data output speeds.

SUMMARY OF THE INVENTION

An object of the present invention is to provide a semiconductor memory device and method that substantially obviate one or more of the problems, limitations and disadvantages of the related art.

Another object of the present invention is to provide a semiconductor memory device that reduces a time difference between the data output operations from sequentially activated word lines.

Still another object of the present invention is to provide a semiconductor device and method that reduces time between data output operations from a preceding word line and the data output operations from succeeding word lines to enhance data output speed.

To achieve these and other advantages in whole or in part and in accordance with the purpose of the present invention, as embodied and broadly described, a semiconductor memory device includes a memory cell array arranged with multiple memory cells having word lines and bit lines; a row decoder for decoding the row address to select the desired word line of the memory cell array; a sense amplifier for sensing and amplifying the data in the memory cell coupled to the activated word line when the data is applied to the bit line; a first latch in which the data taken from a memory cell coupled to a preceding activated word line is stored using the sense amplifier; a second latch in which the data taken from a memory cell coupled to a succeeding activated word line is stored using the sense amplifier; a switching block for controlling the data path between the sense amplifier and the first latch or between the sense amplifier and the second latch; a column decoder for selecting and outputting the data stored in the first or second latch to a data bus and a data bus sense amplifier for amplifying the data applied to the data bus before transmitting it to a data output buffer.

To further achieve these and other objects in whole or in part, a semiconductor device is provided according to the present invention that includes a memory cell array having a matrix of memory cells and a plurality of substantially perpendicular word lines and bit lines, wherein each of the memory cells is coupled to a corresponding one of the word lines and the bit lines; a sense amplifier for sensing and amplifying data of a currently selected memory cell, wherein the memory cells are sequentially selected by designating a word line of the plurality of word lines and a bit line of the plurality of bit lines; a first storage unit that stores data from the currently selected memory cell received from the sense amplifier; a second storage unit that stores data from the next sequentially selected memory cell; and an output selection unit that selects and outputs the data stored in the first or second storage unit and an output data bus.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3(a)–3(f) are diagrams showing of a read operation timing chart of a related art semiconductor memory device;

FIG. 4 is a block diagram showing a preferred embodiment of a semiconductor memory cell array according to the present invention; and FIGS. 5(a)–5(d) are diagrams showing operation timing characteristics according to the memory cell array of FIG. 4.

DETAILED DESCRIPTION OF PREFERRED EMBODIMENTS

Figure 1:
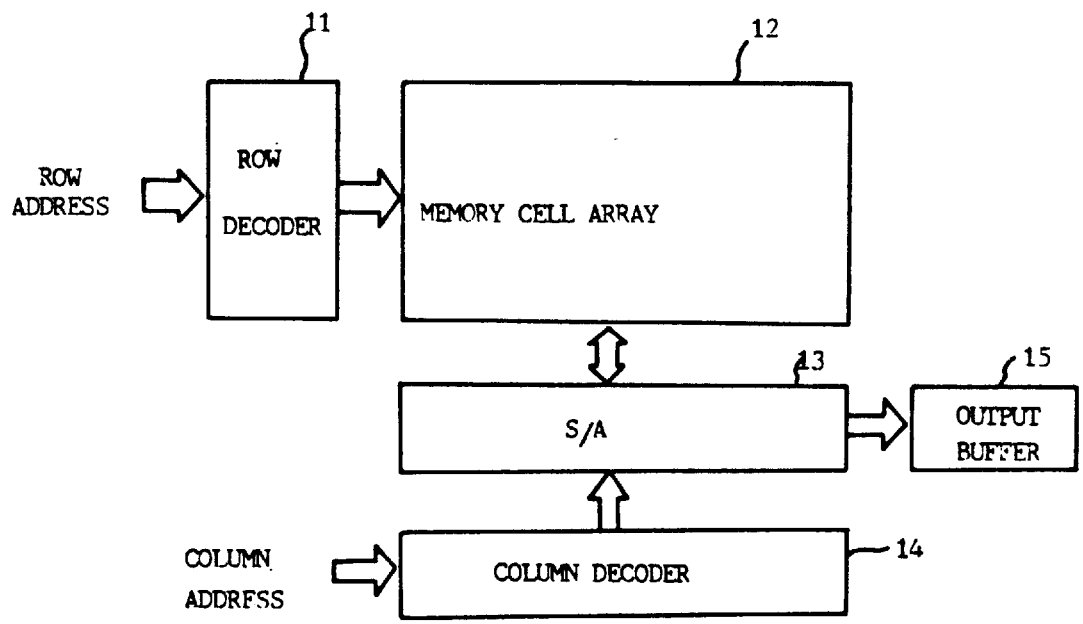
FIG. 1 is a block diagram showing a related art semiconductor memory cell array and peripheral circuits.
Figure 2:
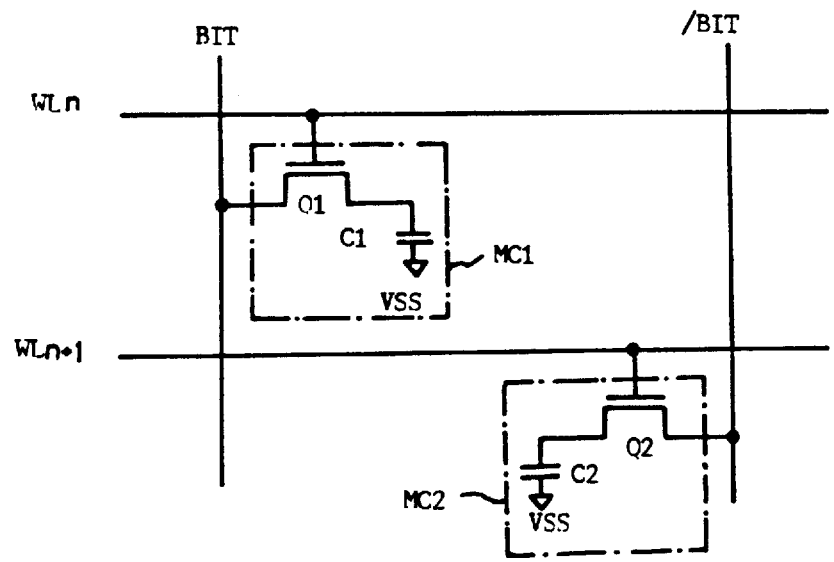
FIG. 2 is a circuit diagram showing a unit memory cell that constitutes the memory cell array of FIG. 1.

FIG. 4 is a block diagram showing the structure of one preferred embodiment of a semiconductor memory cell array according to the present invention. As shown in FIG. 4, a row decoder 21 decodes the row address for selecting and activating one word line of a memory cell array 22. When the data of the memory cell coupled to the activated word line is applied to a bit line, a sense amplifier 23 senses and amplifies the data.

The data amplified by the sense amplifier 23 is stored in one of the two independent latches 26' and 26". Thus, the data accessed from the one activated word line is stored in one of the two latches. The two independent latches 26' and 26" are coupled through a switching block 27, which switches on and off in accordance with a control signal SWC.

A column decoder 24 decodes the column address, and then selects one of the two latches 26' and 26" so that the data stored in the latches 26' and 26" may be applied to the data bus (not shown). The data applied to the data bus is amplified, by means of a data bus sense amplifier 25, and transmitted to the output buffer.

Operations of the preferred embodiment will now be described. The appropriate word line WLn is activated by the row address decoded in the row decoder 21 so that the data in the respective memory cells that correspond to the word line WLn are applied to bit lines. The data applied to the appropriate bit line is sensed and amplified to a slightly larger signal by the sense amplifier 23 coupled to the end of the respective bit lines. The amplified data then remains temporarily in the sense amplifier 23.

The control signal SWC couples the activated sense amplifier 23 to the latch 26', for example, to store the amplified data from the sense amplifier 23 in the latch 26'. When the data is stored in the latch 26', the sense amplifier 23 and the latch 26' are decoupled from each other by the control signal SWC. The sense amplifier 23 is also decoupled from the other latch 26". The sense amplifier 23, which is decoupled from latch 26', refreshes the data in the respective memory cells of the activated word line WLn.

When the data refresh is completed, the activated word line WLn is deactivated because its voltage is lowered to the low level. Accordingly, the NMOS transistor of the memory cell is turned off so that the refreshed data is preserved in the capacitor. The precharge voltage VCC/2 is applied to the respective bit lines to place them in the standby state.

The data stored in the latch 26' is applied to the data bus by the bit line selection signal transmitted from column decoder 24. Which one of two latches, 26' and 26" that transmits data to the data bus is determined by the bit line selection signal transmitted from the column decoder 24. The data applied to the data bus is amplified by the data bus sense amplifier 25, and then transmitted to the data output buffer.

When the word line WLn and the respective bit lines are placed in the data output stand-by state, word line WLn+1, which will output the next data, is activated. When the word line Wln+1 is activated, the data stored in the respective memory cells coupled to the word line WLn+1 are applied to the respective bit lines. The data applied to the appropriate bit line is sensed and amplified, by the sense amplifier 23 at the end of the respective bit lines, to produce a slightly larger signal that remains temporarily in the sense amplifier 23.

The switching block 27 couples the activated sense amplifier 23 to the latch 26", for example, to store the data of the sense amplifier 23 in the latch 26". When the data is stored in the latch 26", the sense amplifier 23 and the latch 26" are decoupled from each other by means of the switching block 27. The sense amplifier 23 is also decoupled from the latch 26'.

The sense amplifier 23, disconnected from the latch 26", refreshes the data in the respective memory cells of the activated word line WLn+1. When the refreshment is completed, the word line is deactivated because its voltage is returned to the low level. Accordingly, the NMOS transistor of the memory cell is turned off so that the refreshed data is preserved by the capacitor. The precharge voltage VCC/2 is applied to the respective bit lines to put them in the stand-by state.

The data stored in the latch 26", is applied to the data bus by the bit line selection signal transmitted from the column decoder 24. In other words, which of the two latches 26' and 26" that applies the data to the data bus is determined by the bit line selection signal transmitted from the column decoder 24. The data applied to the data bus is amplified by the data bus sense amplifier 25 and then transmitted to the output buffer.

FIGS. 5(a)–5(d) are diagrams showing timing signals for operations of the preferred embodiment. FIG. 5(a) indicates the activation timing of the preceding word line WLn and FIG. 5(b) indicates the output timing of the data Dn, which is transmitted after activation of the preceding word line WLn. FIG. 5(c) indicates the activation timing of the succeeding word line WLn+1. FIG. 5(d) indicates the output timing of the data Dn+1, which is transmitted after activation of the succeeding word line WLn+1.

As shown in FIG. 5(a), one word line (e.g., WLn) is activated so that the data of the memory cell is stored in a latch, and then, the word line (e.g., WLn) is deactivated. Immediately, another word line FIG. 5(c) can be activated (e.g., WLn+1). Then, the data of the memory cell corresponding to FIG. 5(c) is stored in another latch.

Accordingly, the activation of the succeeding word line that is usually performed at time t2 of FIG. 5 can be performed earlier. Thus, the activation of the succeeding word line is performed at time t1 so that the data output time can be reduced by time difference Δt between the time points t1 and t2.

As described above, the preferred embodiment of the semiconductor device of the present invention has various advantages. The preferred embodiment reduces the time difference between the data output operation from a preceding word line and the data output operation from a succeeding word line. Thus, the data output speed is enhanced.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor memory device, comprising:
    a memory cell array that has a plurality of substantially perpendicular word lines and bit lines, and a plurality of memory cells;
    a row decoder that decodes a row address to activate a first word line of the memory cell array and a succeeding row addresses to sequentially activate word lines of the memory cell array;
    a sense amplifier that senses and amplifies data of a selected memory cell coupled to an activated word line of the memory cell array when the data is applied to a corresponding bit line;
    a switching block connected to the sense amplifier;
    a first latch connected to the switching block that stores data from the selected memory cell coupled to the first word line received from the switching block;
    a second latch connected to the switching block that stores data from the selected memory cell coupled to the next activated word line received from the switching block, wherein the next activated word line is a second word line, wherein the switching block selects one of a first data path between the switching block and the first latch and a second data path between the switching block and the second latch;
    a column decoder that selects and applies the data stored in one of the first latch and the second latch to a data bus; and
    a data bus sense amplifier that transmits the data applied to the data bus to a data output buffer.

2. The semiconductor memory device of claim 1, wherein the data from the selected memory cell coupled to the second word line is stored in the second latch while the data stored in the first latch is transmitted by the data bus sense amplifier.

3. The semiconductor memory device of claim 1, wherein data from a selected memory cell coupled to another next activated word line is stored in the first latch while the data stored in the second latch is transmitted by the data bus sense amplifier.

4. The semiconductor memory device of claim 1, wherein the first and second storage units reduce a time between sequential data outputs by the semiconductor memory device.

5. The semiconductor memory device of claim 1, wherein the switching block is controlled by a control signal.

6. The semiconductor memory device of claim 1, wherein the data bus sense amplifier amplifies the data applied to the data bus.

7. The semiconductor memory device of claim 1, wherein the memory cells coupled to the activated word line are refreshed prior to deactivation of the word line.

8. A semiconductor device, comprising:

a memory cell array having a matrix of memory cells and a plurality of substantially perpendicular word lines and bit lines, wherein each of the memory cells is coupled to a corresponding one of the word lines and the bit lines;

a sense amplifier that senses and amplifies data of a currently selected memory cell, wherein the memory cells are selected by designating a word line of the plurality of word lines and a bit line of the plurality of bit lines;

a first storage unit that stores data from the currently selected memory cell received from the sense amplifier;

a second storage unit that stores data from a next selected memory cell;

a switching block connected between the sense amplifier and each of the first and second latches that selects a least one of a first data path between the sense amplifier and the first storage unit and a second data path between the sense amplifier and the second storage unit; and an output selection unit that selects and outputs the data stored in the first or second storage unit for transmission to an output data bus.

9. The semiconductor device of claim 8, wherein the data from the next sequentially selected memory cell is stored in the second storage unit while the data stored in the first storage unit is outputted by the output selection unit.

10. The semiconductor device of claim 8, wherein data from a subsequent sequentially selected memory cell is stored in the first storage unit while the data stored in the second storage unit is outputted by the output selection unit.

11. The semiconductor device of claim 8, wherein the first and second storage units reduce the time between sequential data outputs by the output selection unit.

12. The semiconductor device of claim 8, further comprising:

a row decoder that decodes a row address to activate the designated word line of the memory cell array; and a column decoder that decodes a column address to specify the designated bit line of the plurality of bit lines.

13. The semiconductor device of claim 8, further comprising:

a row decoder; and a column decoder, wherein the row decoder decodes a row address and the column decoder decodes a column address to identify the currently selected memory cell.

14. The semiconductor device of claim 8, wherein the first storage unit and the second storage unit respectively store data received from the sense amplifier.

15. The semiconductor device of claim 8, wherein the output selection unit is a column decoder that receives an input column address.

16. The semiconductor device of claim 8, further comprising a data bus sense amplifier that transmits the data applied to the output data bus to an output buffer.

17. A semiconductor memory device, comprising:

a memory cell array that has a plurality of substantially perpendicular word lines and bit lines, and a plurality of memory cells;

a row decoder that decodes a row address to activate a first word line of the memory cell array and succeeding row addresses to sequentially activate word lines of the memory cell array;

a column decoder that decodes a column address to activate a first bit line of the memory cell array and succeeding column addresses to sequentially activate bit lines of the memory cell array;

a sense amplifier that sequentially senses and amplifies data of selected memory cells coupled to an activated word line of the memory cell array when the data is applied to a corresponding bit line;

first and second latches that store data from the selected memory cells, respectively;

a switching block directly connected between the sense amplifier and the first and second latches that selects a least one of a first output path between the switching block and the first latch and a second output path between the switching block and the second latch for each of the data from the selected memory cells, wherein the column decoder selects the data stored in one of the first latch and the second latch for output; and a data bus sense amplifier that transmits the selected output data from the first and second latches.

* * * * *

UNITED STATES PATENT AND TRADEMARK OFFICE
CERTIFICATE OF CORRECTION

PATENT NO. : 5,877,990
DATED : March 2, 1999
INVENTOR(S) : Tae-Hyoung KIM

It is certified that error appears in the above-identified patent and that said Letters Patent is hereby corrected as shown below:

On the title page, and Column 1, line 3 delete the following:
[60], delete "Provisional application No. 60/002,674, Jun. 20, 1995."

Signed and Sealed this

Twentieth Day of July, 1999

Attest:

Attesting Officer

Q. TODD DICKINSON

Acting Commissioner of Patents and Trademarks